United States Patent
Ochiai

(10) Patent No.: US 11,923,037 B2
(45) Date of Patent: Mar. 5, 2024

(54) MEMORY CONTROL CIRCUIT AND METHOD FOR CONTROLLING THE SAME

(71) Applicant: CANON KABUSHIKI KAISHA, Tokyo (JP)

(72) Inventor: Wataru Ochiai, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/668,415

(22) Filed: Feb. 10, 2022

(65) Prior Publication Data

US 2022/0270655 A1 Aug. 25, 2022

(30) Foreign Application Priority Data

Feb. 22, 2021 (JP) ................. 2021-026640

(51) Int. Cl.
G11C 7/10 (2006.01)
(52) U.S. Cl.
CPC .......... *G11C 7/1057* (2013.01); *G11C 7/1048* (2013.01); *G11C 7/1069* (2013.01); *G11C 7/1084* (2013.01); *G11C 7/1096* (2013.01)
(58) Field of Classification Search
CPC ... G11C 7/1057; G11C 7/1048; G11C 7/1069; G11C 7/1084; G11C 7/1096

USPC .................................................. 365/189.05
See application file for complete search history.

(56) References Cited

U.S. PATENT DOCUMENTS

| 9,536,121 B2 | 1/2017 | Kato et al. |
| 2015/0046642 A1* | 2/2015 | Lee .................. G06F 13/14 |
| | | 711/167 |

FOREIGN PATENT DOCUMENTS

JP 2017-054483 A 3/2017

\* cited by examiner

*Primary Examiner* — Huan Hoang
(74) *Attorney, Agent, or Firm* — Carter, DeLuca & Farrell LLP

(57) ABSTRACT

A memory control circuit is configured to access a memory including a plurality of banks. The memory control circuit comprises: a holding unit configured to hold an access request from an external circuit; a management unit configured to manage states of the plurality of banks; a determination unit configured to determine, based on an access type of an access request held in the holding unit and the states of the plurality of banks, which access type of command issuance that is read or write is to be prioritized; and an issuance unit configured to issue a command of an access request corresponding to the access type determined to be prioritized by the determination unit, among the access requests held in the holding unit.

9 Claims, 13 Drawing Sheets

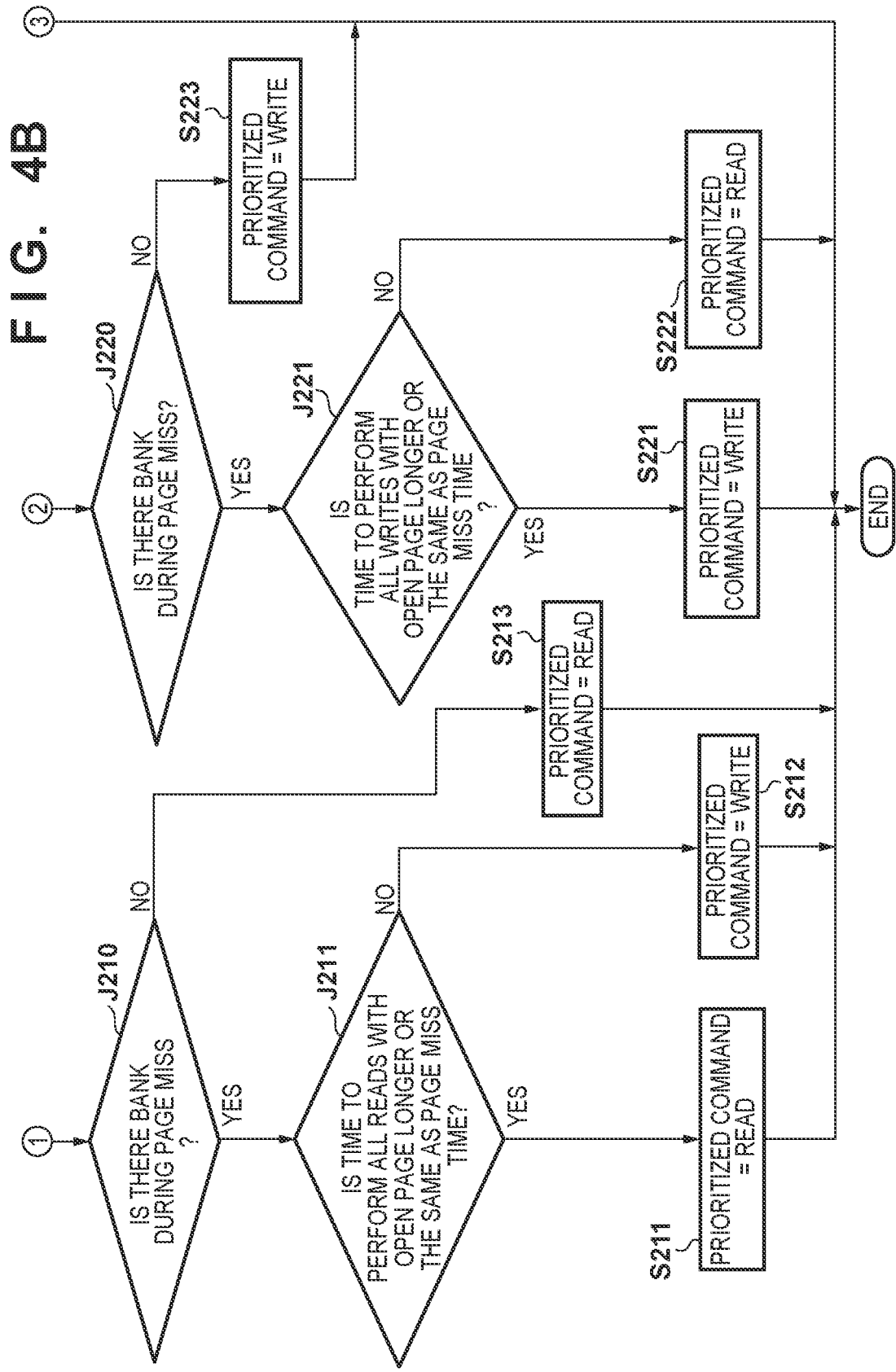

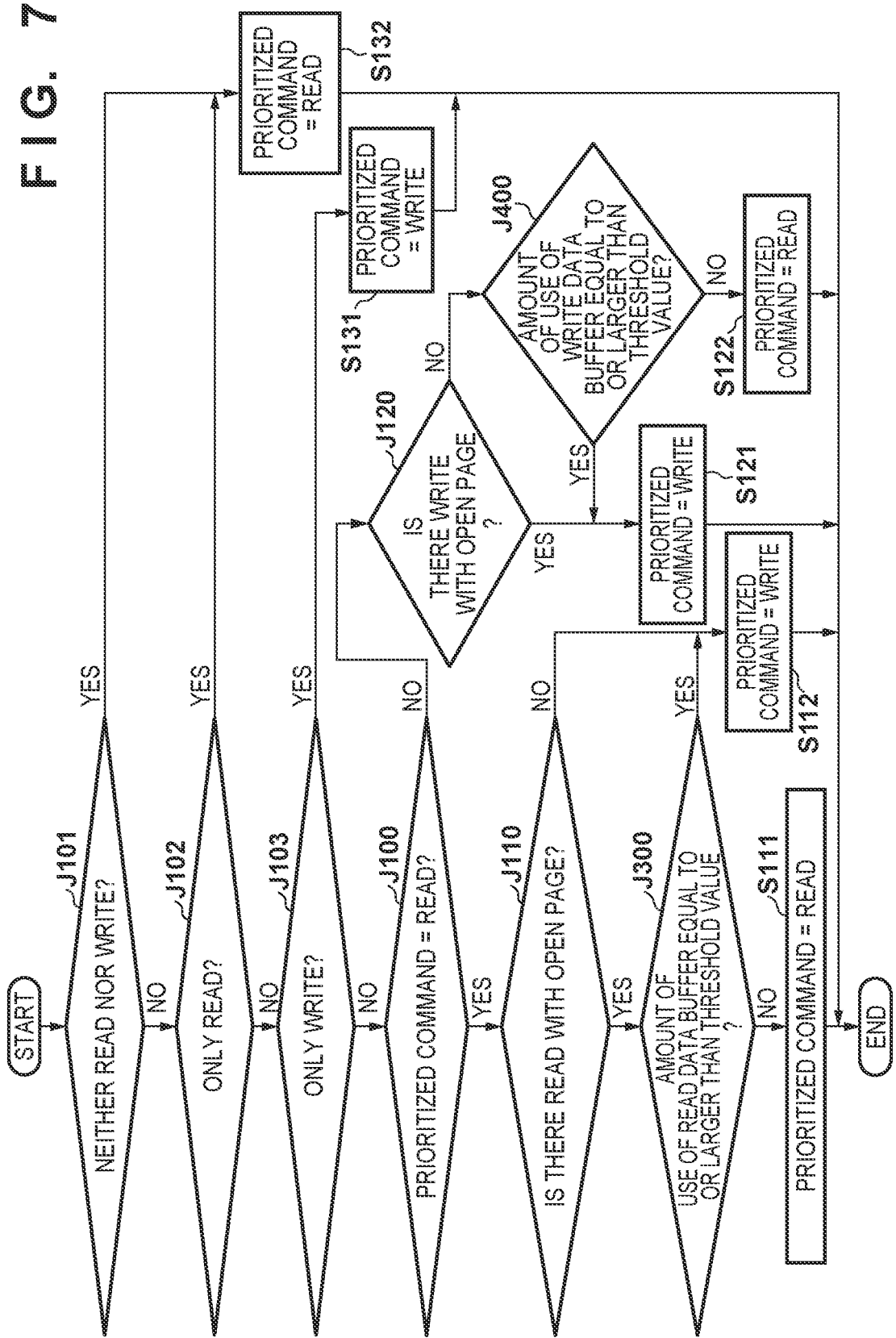

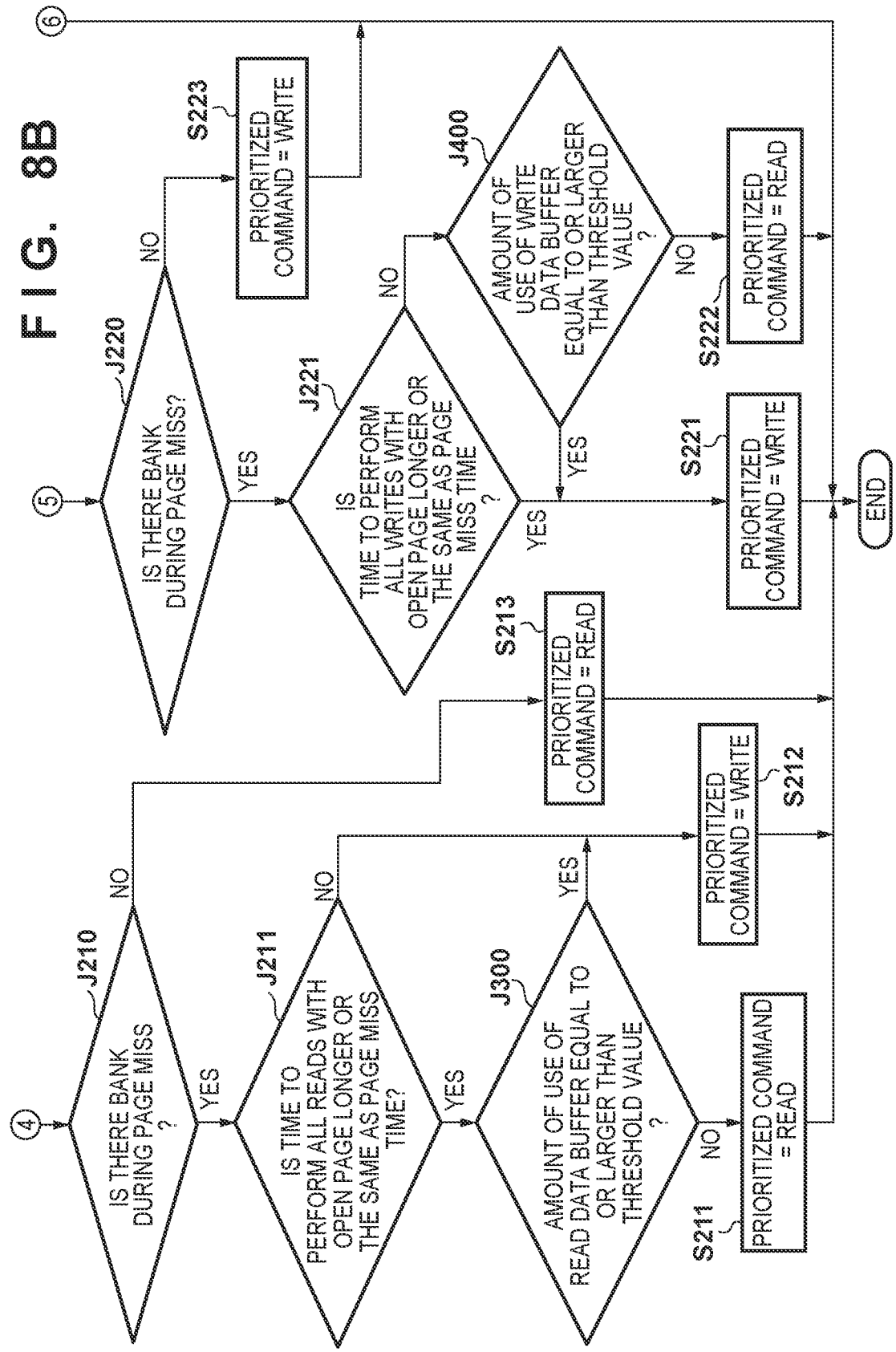

FIG. 9

| From | To | Cycle |
|------|-----|-------|
| RD | RD | 4 |
| WR | WR | 4 |
| ACT | ACT | 2 |
| ACT | RD | 8 |
| ACT | WR | 8 |
| RD | PRE | 4 |
| WR | PRE | 14 |
| PRE | ACT | 8 |
| RD | WR | 11 |
| WR | RD | 11 |

MEMORY CONTROL CIRCUIT AND METHOD FOR CONTROLLING THE SAME

BACKGROUND OF THE INVENTION

Field of the Invention

The present invention relates to a memory control circuit configured to access a memory.

Description of the Related Art

DRAM is generally used as a main storage device in a computer system. Along with enhancement of functionality and performance of computer systems, there is increasing demand for higher performance of DRAM, and for exerting its performance to a maximum extent.

A major factor of performance degradation of DRAM is occurrence of a page miss or switching between read and write. Japanese Patent Laid-Open No. 2017-054483 (Patent Literature 1) discloses a technique that, in order to suppress performance degradation due to switching between read and write, sets read or write as a prioritized command and switches prioritized commands after having fetched all the prioritized commands from a command queue.

However, Patent Literature 1 does not take into account performance degradation due to a page miss of DRAM. Accordingly, performance degradation of DRAM cannot be suppressed when there are many page misses occurring in a command corresponding to a prioritized command.

SUMMARY OF THE INVENTION

According to one aspect of the present invention, a memory control circuit configured to access a memory including a plurality of banks, the memory control circuit comprises: a holding unit configured to hold an access request from an external circuit; a management unit configured to manage states of the plurality of banks; a determination unit configured to determine, based on an access type of an access request held in the holding unit and the states of the plurality of banks, which access type of command issuance that is read or write is to be prioritized; and an issuance unit configured to issue a command of an access request corresponding to the access type determined to be prioritized by the determination unit, among the access requests held in the holding unit.

The present invention suppresses performance degradation due to switching between read and write as well as page misses.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 4A and 4B are a flowchart of determining a prioritized command according to a second embodiment;

FIG. 7 is a flowchart of determining a prioritized command according to the third embodiment;

FIGS. 8A and 8B are a flowchart of determining a prioritized command according to the fourth embodiment;

FIG. 9 illustrates an example of a shortest command issuance interval;

DESCRIPTION OF THE EMBODIMENTS

Figure 1:
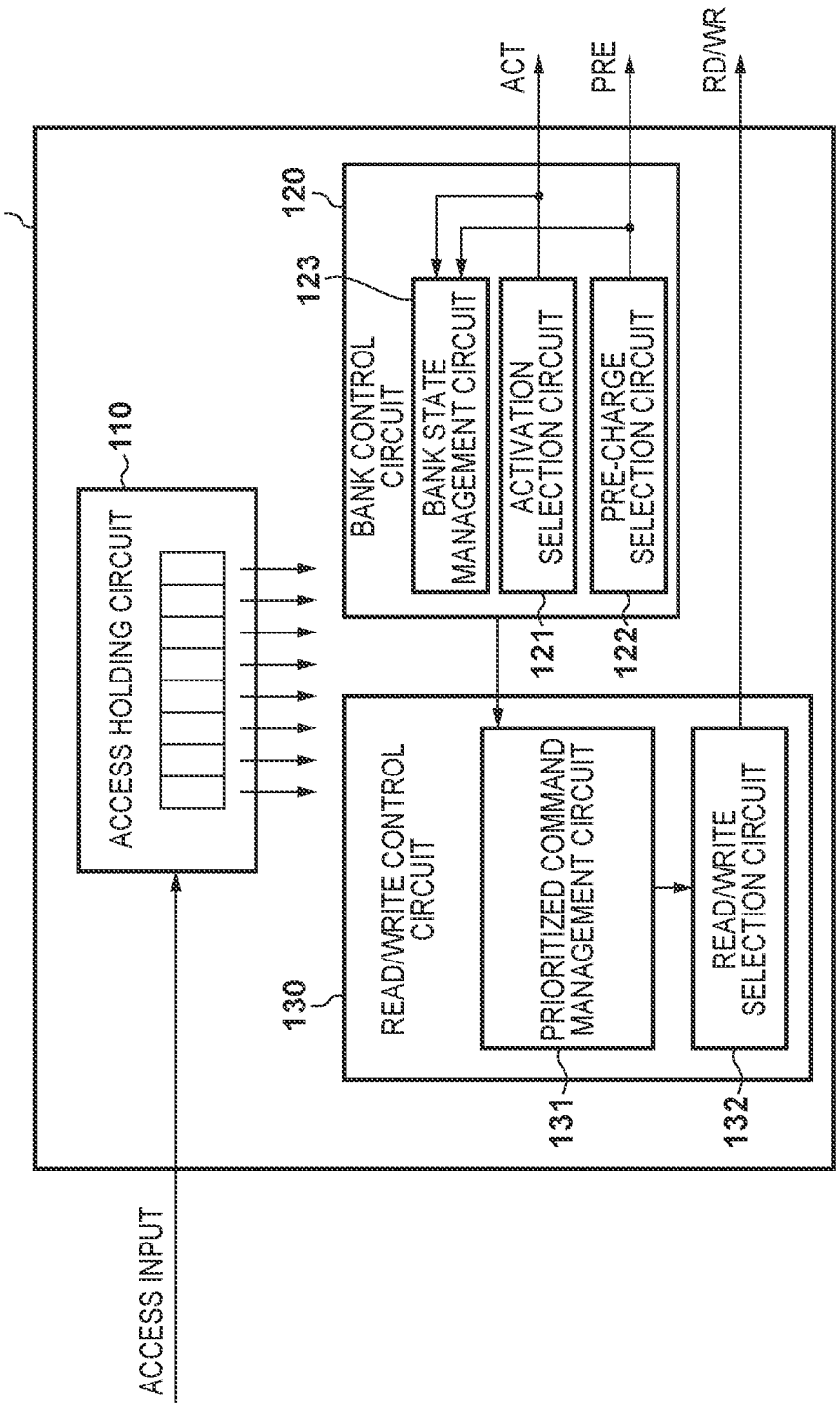
FIG. 1 illustrates a configuration of a memory control circuit according to a first and a second embodiments.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

A first embodiment of a memory control circuit according to the present invention will be described below, taking as an example a memory control circuit configured to suppress performance degradation due to occurrence of a page miss or switching between read and write.

<Configuration of Memory Control Circuit>

FIG. 1 illustrates a configuration of a memory control circuit 100 according to the first embodiment. The memory control circuit 100 is a circuit configured to issue an access command to the memory based on an access input received from an external circuit.

An access holding circuit 110 holds a plurality of access requests received from the external circuit. A bank control circuit 120 includes an activation selection circuit 121, a pre-charge selection circuit 122, and a bank state management circuit 123.

The activation selection circuit 121 determines which access to the bank is to be activated, among the accesses held in the access holding circuit 110, and issues an activation (ACT) command. The pre-charge selection circuit 122 determines which access to the bank is to be pre-charged, among the accesses held in the access holding circuit 110, and issues a pre-charge (PRE) command. The bank state management circuit 123 monitors issuances of the activation command and the pre-charge command to manage the state of the bank.

A read/write control circuit 130 includes a prioritized command management circuit 131 and a read/write selection circuit 132.

The prioritized command management circuit 131 uses the bank state managed by the bank state management circuit 123 to determine which access type of command issuance that is read or write is to be prioritized. In the following, the access type of command issuance to be prioritized is referred to as a prioritized command. Details will be described below, referring to FIG. 2. The read/write control circuit 132 determines, from accesses held in the access holding circuit 110, an access (read or write) corresponding to the access type indicated by the prioritized command, and issues a read (RD) command or a write (WR) command.

<Operation of Memory Control Circuit>

Figure 2:
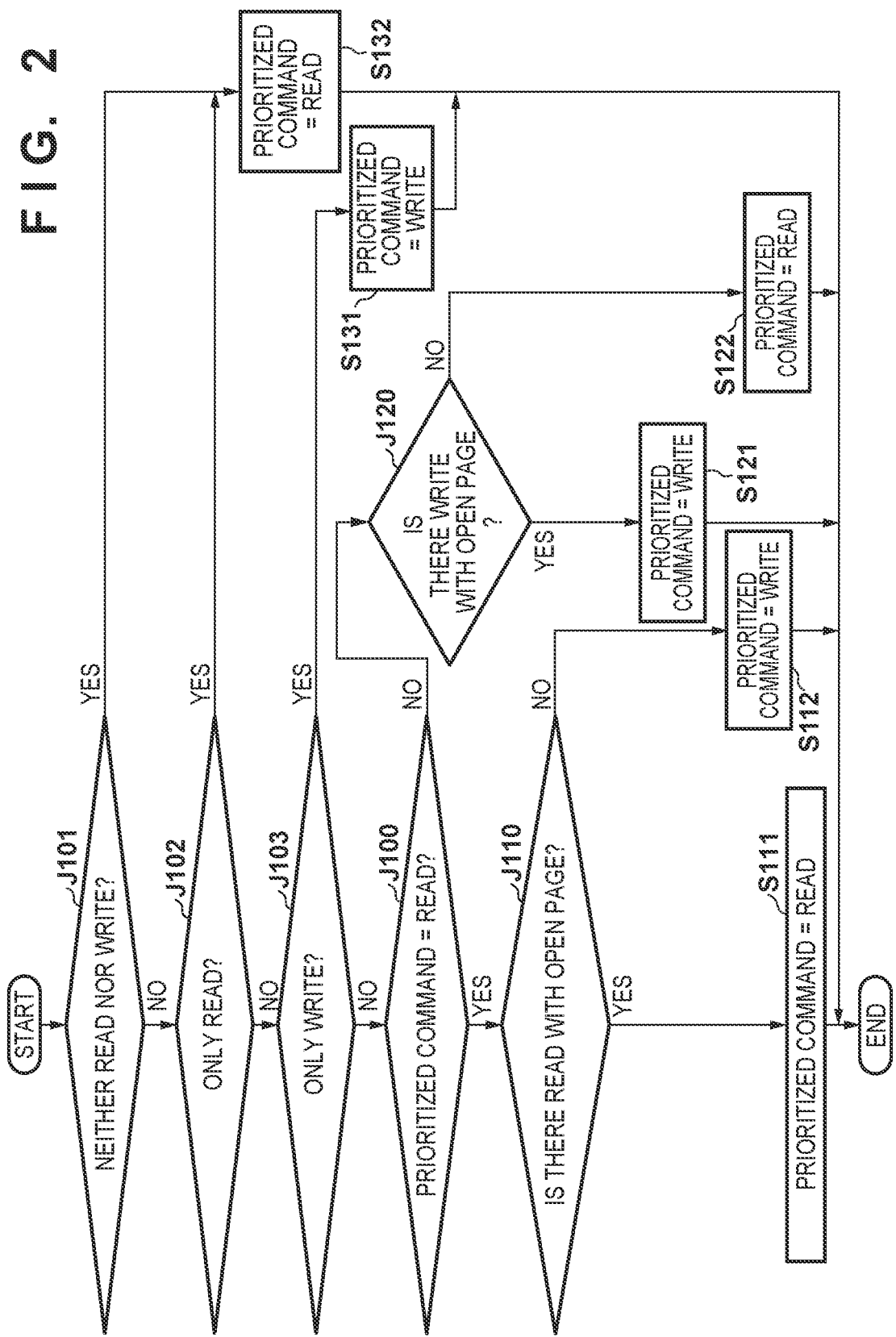
FIG. 2 is a flowchart of determining a prioritized command according to the first embodiment.

FIG. 2 is a flowchart of determining a prioritized command according to the first embodiment. Specifically, there is illustrated an operation of determining a prioritized command by the prioritized command management circuit 131. The prioritized command management circuit 131 is supposed to determine a prioritized command according to the flowchart for each cycle. In addition, when there is no access held in the access holding circuit 110, read turns out to be the prioritized command.

From J101 to J103, the prioritized command management circuit 131 determines whether or not there is a read and/or write command in the access holding circuit 110. When there is neither read nor write (YES at J101). "read" is set as the prioritized command (S132). When there is only read (YES at J102). "read" is set as the prioritized command (S132). When there is only write (YES at J103), "write" is set as the prioritized command (S131).

When there are both read and write (NO at J103), it is determined whether or not the current prioritized command is read or write (3100). Here, the current prioritized command is the access type (read or write) determined to be prioritized in the previous cycle.

When the prioritized command is "read" (YES at J100), it is determined whether or not there is an access of the same direction as the prioritized command (here, "read") with a corresponding page being already open. When the prioritized command is "write" (NO at J100), it is determined whether or not there is an access of the same direction as the prioritized command (here, "write") with a corresponding page being already open.

When there is a corresponding access, the prioritized command is not changed (S111, S121), or the prioritized command is changed when there is no corresponding access (S112, S122).

Figure 3:
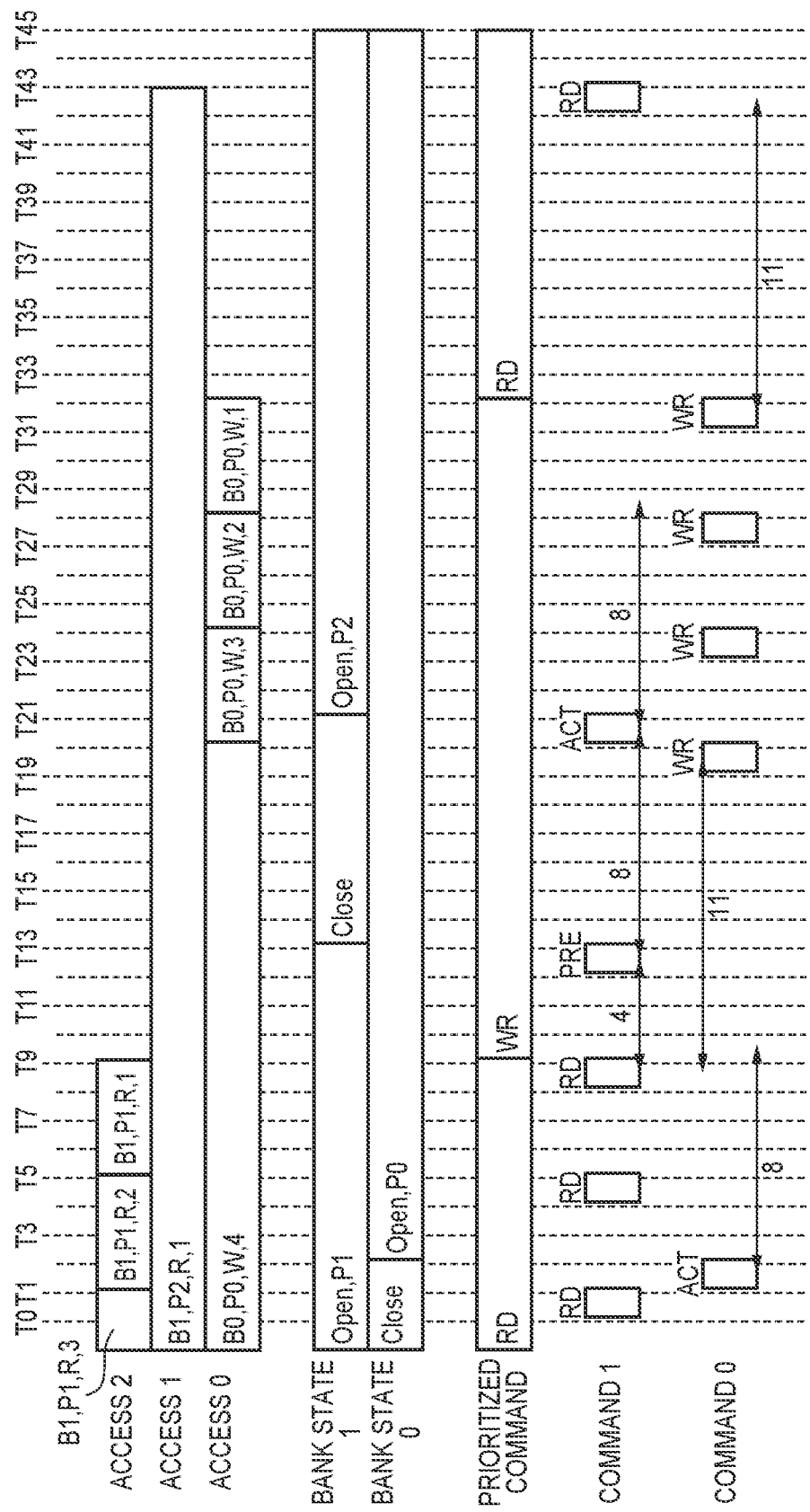
FIG. 3 is a timing chart illustrating an operation of the memory control circuit.

FIG. 3 is a timing chart illustrating an operation of the memory control circuit 100. In addition, FIG. 9 illustrates an example of the shortest issuance interval between respective commands preliminarily specified. For example, when issuing read commands in succession, it is necessary to space apart the first read command and the second read command by at least four cycles.

Here, it is assumed that the access holding circuit 110 holds three accesses, respectively expressed as access 0, access 1 and access 2. Each access includes "bank, page, read/write, number of times" as its content. Here, the number of times is assumed to be decremented each time a read or a write command is issued.

In addition, it is assumed here that the number of banks is two, and the bank state managed by the bank state management circuit 123 is expressed as bank state 0 and bank state 1. Each bank state includes "open/close, page (in the case of open)" as its content.

Furthermore, the command to the bank 0 issued by the activation selection circuit 121, the pre-charge selection circuit 122, and the read/write selection circuit 132 is expressed as command 0, and the command to the bank 1 is expressed as command 1.

At T0, it is assumed that the bank 0 is in a closed state, and the bank 1 is in a state of the page 1 being open. At T1, a read command is issued to the bank 1 for the access 2, and the number of times of the access 2 is decremented. At T2, an activation command is issued to the bank 0 for the access 0, and the bank state 0 changes to open.

At T5 and T9, a read command is issued to the bank 1 for the access 2 again, whereby the access 2 is completed and deleted from the access holding circuit 110. At T9 the prioritized command management circuit 131 changes the prioritized command to write, since a page miss has occurred in the access 1 but there is no read with an open page.

At T13, a pre-charge command is issued to the bank 1 for the access 1, and the bank state 1 changes to close. At T20, a write command is issued to the bank 0 for the access 0, and the number of times of the access 0 is decremented. At T21, an activation command is issued to the bank 1 for the access 1, and the bank state 1 changes to open.

At T24, T28 and T32, a write command is issued to the bank 0 for the access 0 again, whereby the access 0 is completed and deleted from the access holding circuit 110. At T32, the prioritized command management circuit 131 changes the prioritized command to read since there is no write with an open page.

At T43, a read command to the bank 1 for the access 1 is issued, whereby the access 1 is completed and deleted from the access holding circuit 110.

<Effect>

Figure 10:
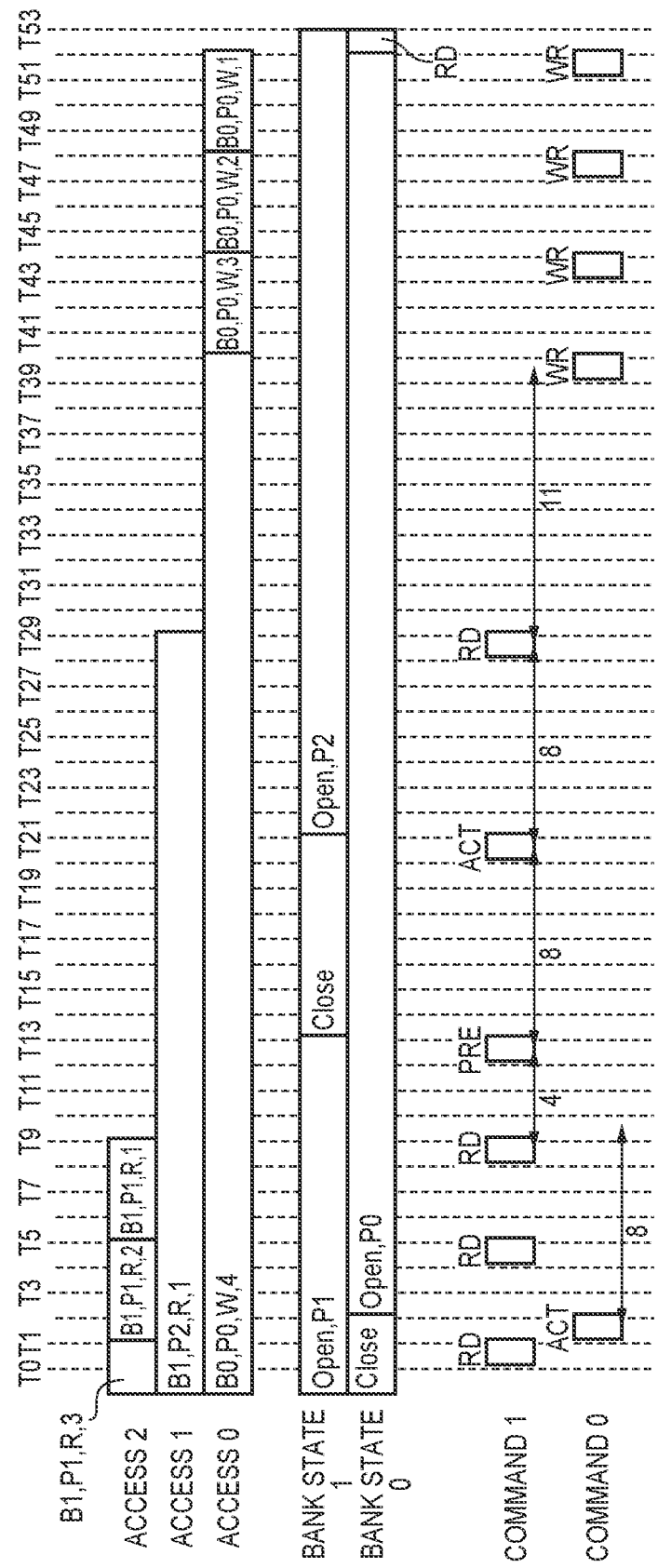
FIG. 10 is a timing chart illustrating an operation of a memory control circuit (related art)

FIG. 10 is a timing chart illustrating an operation of a memory control circuit in the related art. Specifically. FIG. 10 illustrates an operation of a memory control circuit in the related art for the access similar to that of FIG. 3. In the related art, write is assumed to be performed after all the reads have been performed, and therefore the last write is performed at T52. In other words, the last read is performed at T43 in the first embodiment, and it can be seen that the process can be completed earlier than the related art.

As has been described above, according to the first embodiment, the prioritized command is determined, taking into account the state of the bank. Accordingly, it is possible to suppress performance degradation due to a page miss. Particularly, the prioritized command is not switched in a case where the current prioritized command can suppress performance degradation due to a page miss. On the other hand, the prioritized command is switched in a case where the current prioritized command cannot suppress performance degradation due to a page miss.

Second Embodiment

In a second embodiment, there will be described a configuration for determining a prioritized command further taking into account presence or absence of a bank in which a page miss has occurred. Here, the configuration of the memory control circuit is similar to that of the first embodiment (FIG. 1), and therefore description thereof will be omitted.

<Operation of Memory Control Circuit>

Figure 4A:
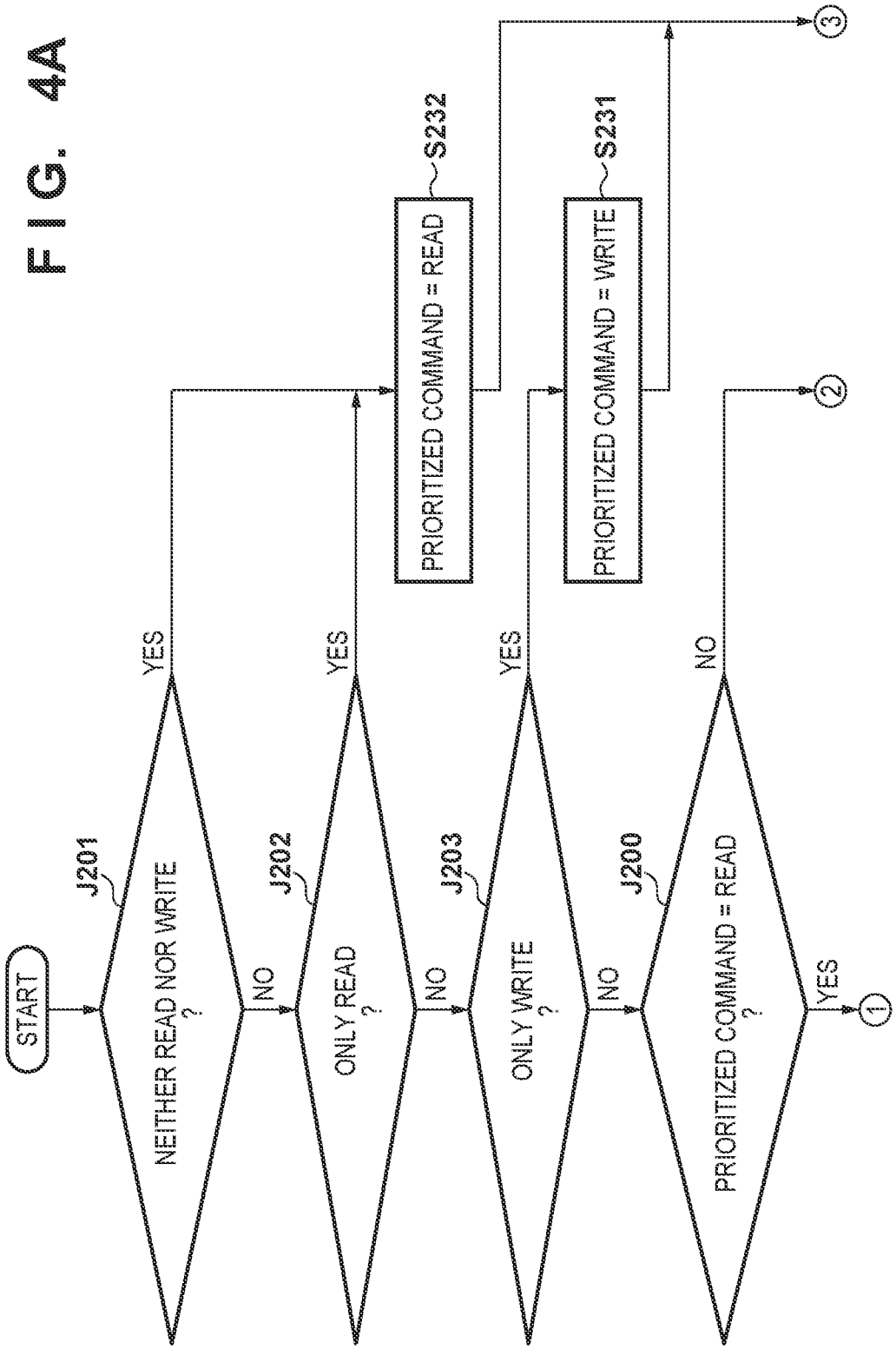

FIGS. 4A and 4B are a flowchart of determining a prioritized command according to the second embodiment. Specifically, there is illustrated an operation of determining a prioritized command by the prioritized command management circuit 131. The prioritized command management circuit 131 is supposed to determine a prioritized command according to the flowchart for each cycle. In addition, when there is no access held in the access holding circuit 110, "read" is used as the prioritized command.

From J201 to J203, the prioritized command management circuit 131 determines whether or not there is a read and/or write command in the access holding circuit 110. When there is neither read nor write (YES at J201), "read" is set as the prioritized command (S232). When there is only read (YES at J202), "read" is set as the prioritized command (S232). When there is only write (YES at J203), "write" is set as the prioritized command (S231).

When there are both read and write (NO at J203), it is determined whether the prioritized command is read or write (J200).

When the prioritized command is "read" (YES at J200), it is determined whether or not there is a bank during a page miss (J210). When there is a bank during a page miss, the process flow proceeds to J211, otherwise the prioritized command is not changed (S213). At J211, it is determined whether or not the time required for performing all the same directions (here "read") as the prioritized command with an open page is equal to or longer than a page miss time. When it is longer (or equal) (YES at J211), the prioritized command is not changed (S211). When, on the other hand, it is shorter than the page miss time (NO at J211), the prioritized command is changed to "write" (S212).

When the prioritized command is "write" (NO at J200), it is determined whether or not there is a bank during a page miss (3220). When there is a bank during a page miss, the process flow proceeds to J221, otherwise the prioritized command is not changed (S223). At J221, it is determined whether or not the time required for performing all the same directions (here "write") as the prioritized command with an open page is longer than the page miss time. When it is longer (or equal) (YES at J221), the prioritized command is not changed (S221). When, on the other hand, it is shorter (NO at J221) the prioritized command is changed to "read" (S222).

Figure 5:
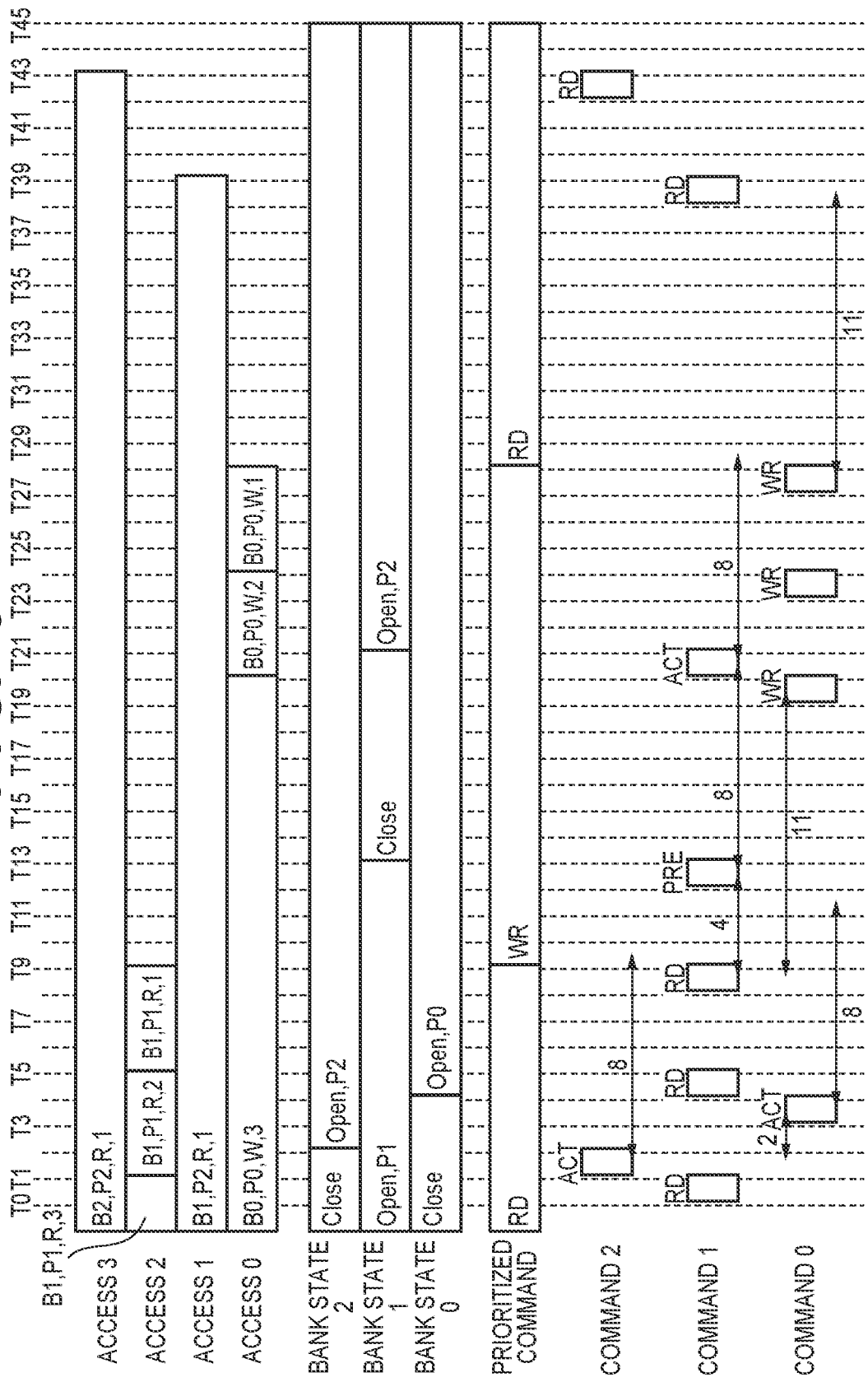
FIG. 5 is a timing chart illustrating an operation of the memory control circuit.

FIG. 5 is a timing chart illustrating an operation of the memory control circuit 100. The shortest command issuance interval is assumed to be similar to that of the first embodiment (FIG. 9).

Here, there are four accesses held in the access holding circuit 110, which are represented as access 0, access 1, access 2 and access 3. Each access includes "bank, page, read/write, number of times" as its content. Here, the number of times is assumed to be decremented each time a read or a write command is issued.

In addition, it is assumed here that the number of banks is three, and the bank state managed by the bank state management circuit 123 is expressed as bank state 0, bank state 1 and bank state 2. Each bank state includes "open/close, page (in the case of open)" as its content.

Furthermore, the command to the bank 0 issued by the activation selection circuit 121, the pre-charge selection circuit 122, and the read/write selection circuit 132 is expressed as command 0, the command to the bank 1 is expressed as command 1, and the command to the bank 2 is expressed as command 2.

At T0, it is assumed that the bank 0 is in a closed state, the bank 1 is in a state of the page 1 being open, and the bank 2 is in a closed state. At T1, a read command is issued to the bank 1 for the access 2, and the number of times of the access 2 is decremented. At T2, an activation command is issued to the bank 2 for the access 3, and the bank state 2 changes to open. At T4, an activation command is issued to the bank 0 for the access 0, and bank state 0 changes to open.

At T5 and T9, a read command is issued to the bank 1 for the access 2 again, whereby the access 2 is completed and deleted from the access holding circuit 110. At T9, the prioritized command management circuit 131 determines that the access 3 is a read with an open page but the number of read times is insufficient to satisfy the page miss time of the bank 1, and therefore changes the prioritized command to write. Here, the page miss time refers to the time required to enable the next read.

At T13, a pre-charge command is issued to the bank 1 for the access 1, and the bank state 1 changes to close. At T20, a write command is issued to the bank 0 for the access 0, and the number of times of the access 0 is decremented.

At T21, an activation command is issued to the bank 1 for the access 1, and the bank state 1 changes to open.

At T24, T28, a write command is issued to the bank 0 for the access 0 again, whereby the access 0 is completed and deleted from the access holding circuit 110. At T28, the prioritized command management circuit 131, as there is no write, changes the prioritized command to read. At T39, a read command to the bank 1 for the access 1 is issued, whereby the access 1 is completed and deleted from the access holding circuit 110. At T43, a read command to the bank 2 for the access 3 is issued, whereby the access 3 is completed and deleted from the access holding circuit 110.

<Effect>

Figure 11:
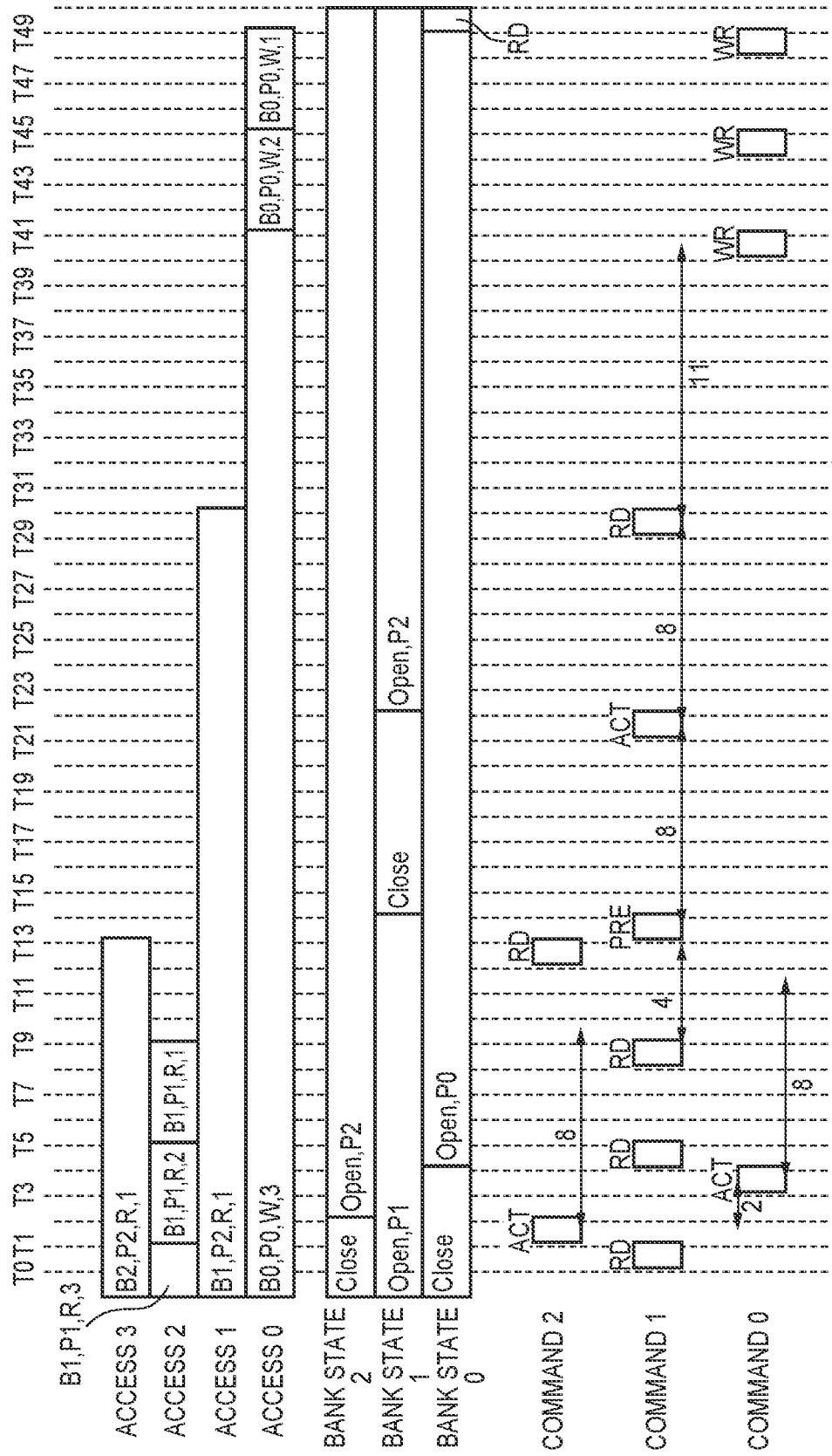
FIG. 11 is a timing chart illustrating an operation of the memory control circuit (related art).

FIG. 11 is a timing chart illustrating an operation of memory control circuit in the related art. Specifically, there is illustrated an operation of a memory control circuit in the related art for an access similar to that in FIG. 5. In the related art, write is assumed to be performed after all the reads have been performed, and therefore the last write is performed at T49. In other words, the last read is performed at T43 in the second embodiment, and it can be seen that the process can be completed earlier than the related art.

As has been described above, according to the second embodiment, the prioritized command is determined, taking into account the state of the bank. Accordingly, it is possible to suppress performance degradation due to a page miss.

Third Embodiment

A third embodiment of the memory control circuit according to the present invention will be described below, taking as an example a memory control circuit configured to suppress performance degradation due to occurrence of a page miss or switching between read and write. In particular, the difference from the first embodiment lies in that the states of the write data buffer and the read data buffer are additionally considered.

<Configuration of Memory Control Circuit>

Figure 6:
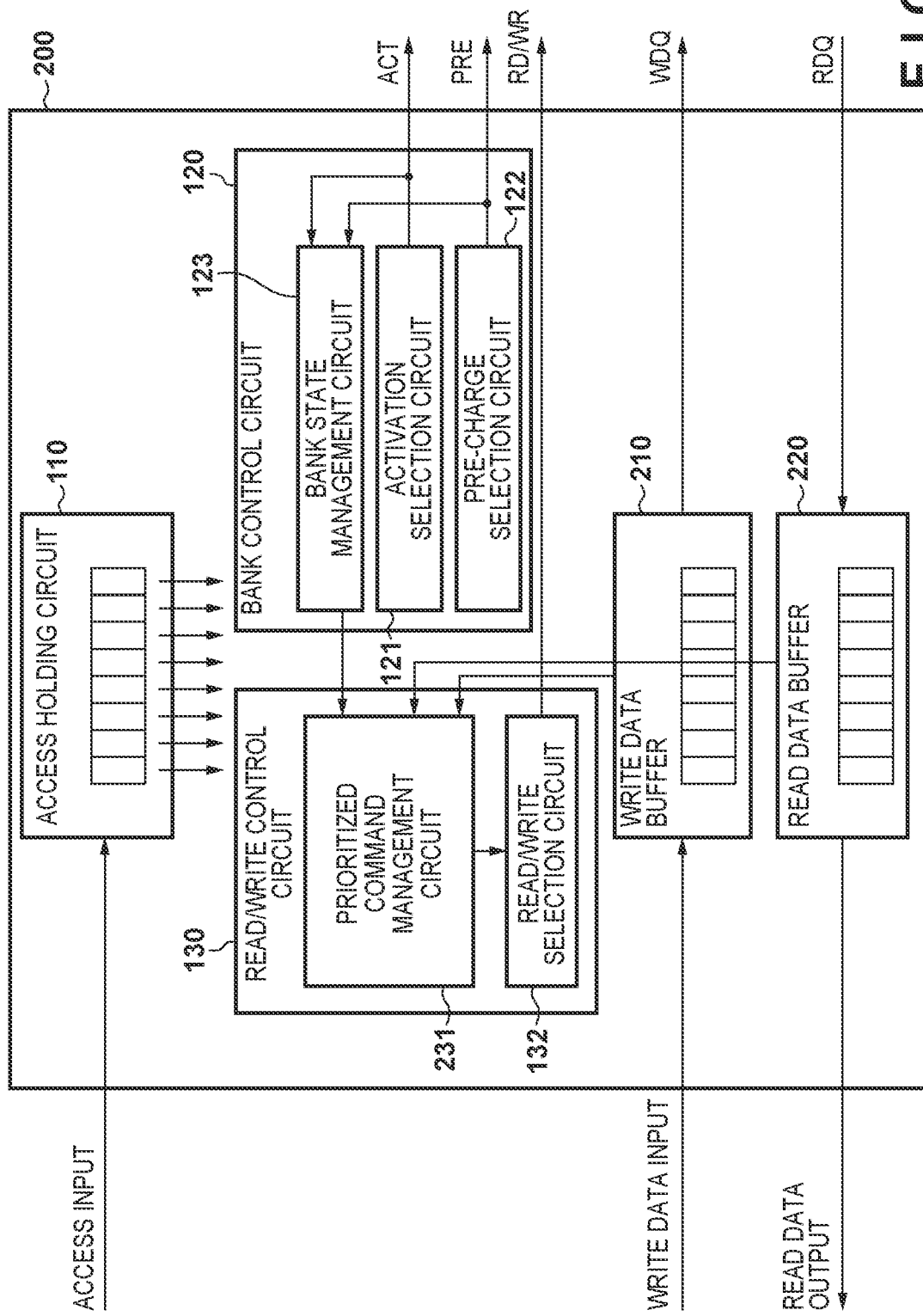
FIG. 6 illustrates a configuration of a memory control circuit according to a third and a fourth embodiments.

FIG. 6 illustrates a configuration of a memory control circuit 200 according to the third embodiment. The memory control circuit 200 is a circuit configured to issue an access command to the memory based on an access input received from an external circuit. The memory control circuit 200 has a write data buffer 210 and a read data buffer 220 added to the memory control circuit 100 of the first embodiment.

The write data buffer 210 is a write buffer used when writing data, which has been input from an external circuit, into a memory (not illustrated). On the other hand, the read data buffer 220 is a read buffer used when an external circuit reads data from a memory (not illustrated). Here, the prioritized command control circuit 231 determines the prioritized command additionally taking into account the states of the buffers.

<Operation of Memory Control Circuit>

FIG. 7 is a flowchart of determining a prioritized command according to the third embodiment. Specifically, there is illustrated an operation of determining a prioritized command by the prioritized command management circuit 231.

The flowchart of FIG. 7 corresponds to the flowchart of the first embodiment (FIG. 2) with J300 and J400 added thereto.

When the prioritized command is "read" (YES at J100) and there is a read with an open page (YES at J110), the process flow proceeds to J300. At J300, the prioritized command management circuit 231 changes the prioritized command to "write" (S112) when the amount of use of the read data buffer is equal to or larger than a threshold value (YES at J300).

When the prioritized command is "write" (NO at J100) and there is no write with an open page (NO at J120), the process flow proceeds to J400. At J400, the prioritized command management circuit 231 does not change the prioritized command (S121) when the amount of use of the write data buffer is equal to or larger than the threshold value (YES at J400).

As has been described above, according to the third embodiment, when the read data buffer is equal to or larger than a threshold value while taking into account the bank state, it is possible not to prioritize "read". In addition, when the write data buffer is equal to or larger than the threshold value, it is possible to prioritize "write" Accordingly, it is possible to further suppress performance degradation due to a page miss.

Fourth Embodiment

In a fourth embodiment, there will be described a configuration for determining a prioritized command further taking into account the presence or absence of a bank during a page miss. Here, the configuration of the memory control circuit is similar to that of the third embodiment (FIG. 6), and therefore description thereof will be omitted.

<Operation of Memory Control Circuit>

Figure 8A:
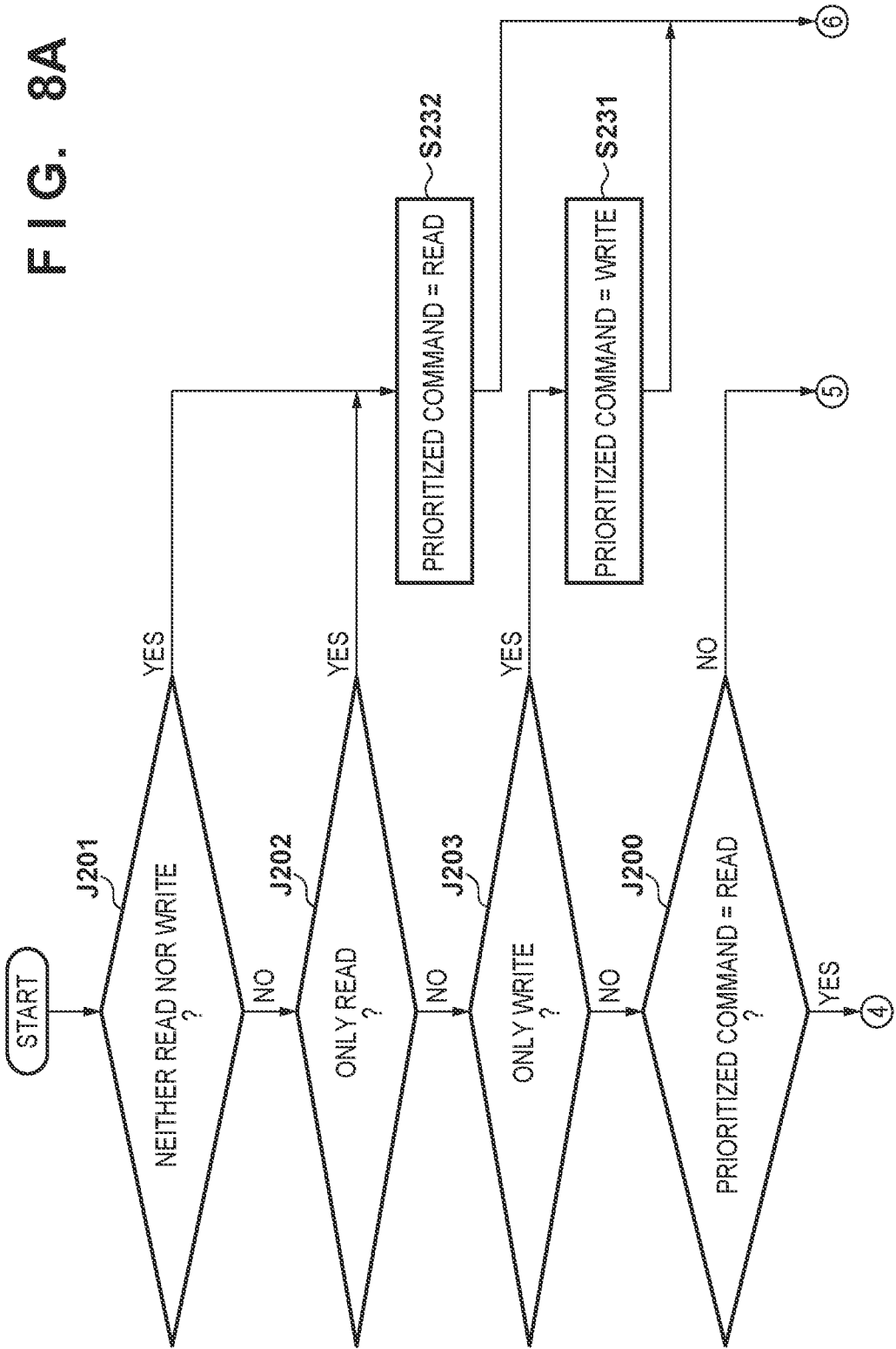

FIGS. 8A and 8B are a flowchart of determining a prioritized command according to the fourth embodiment. Specifically, there is illustrated an operation of determining a prioritized command by the prioritized command management circuit 231. The flowchart of FIGS. 8A and 8B corresponds to the flowchart of the second embodiment (FIGS. 4A and 4B) with J300 and J400 added thereto.

When the prioritized command is "read" (YES at J200) and the time required to perform all the reads with an open page is longer than the page miss time of the bank during the page miss (YES at J211), the process flow proceeds to J300. At J300, the prioritized command management circuit 231 changes the prioritized command to write" (S212) when the amount of use of the read data buffer is equal to or larger than the threshold (YES at J300).

When the prioritized command is "write" (NO at J200) and the time required to perform all the writes with an open page is shorter than the page miss time of the bank during the page miss (NO at J221), the process flow proceeds to J400. At J400, the prioritized command management circuit 231 does not change the prioritized command (S221) when the amount of use of the write data buffer is equal to or larger than the threshold (YES at J400).

As has been described above, according to the fourth embodiment, when the read data buffer is equal to or larger than a threshold value while taking into account the bank state, it is possible not to prioritize "read". In addition, when the write data buffer is equal to or larger than the threshold value, it is possible to prioritize "write" Accordingly, it is possible to further suppress performance degradation due to a page miss.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-026640, filed Feb. 22, 2021 which is hereby incorporated by reference herein in its entirety.

What is claimed is:

1. A memory control circuit configured to access a memory including a plurality of banks, the memory control circuit comprising:
    a holding unit configured to hold access requests from an external circuit;
    a management unit configured to manage states of the plurality of banks;
    a determination unit configured to determine, based on an access type of each of the access requests held in the holding unit and whether the states of the plurality of banks are open, which access type of command issuance that is read or write is to be prioritized; and
    an issuance unit configured to issue a command of an access request corresponding to the access type determined to be prioritized by the determination unit, among the access requests held in the holding unit.

2. The memory control circuit according to claim 1, wherein the management unit manages, for each of the plurality of banks, whether a bank is open and, in a case where the bank is open, which page is open.

3. The memory control circuit according to claim 2, wherein
    the determination unit
    prioritizes read when only read access requests are held in the holding unit,
    prioritizes write when only write access requests are held in the holding unit; and
    when both read and write access requests are held in the holding unit, does not change the prioritized access type in case where there is an access of an access type determined to be prioritized at a previous time by the determination unit, the access already having a page opened, and changes the prioritized access type in case where there is no such access.

4. The memory control circuit according to claim 1, further comprising a bank control unit configured to issue an activation or pre-charge command.

5. The memory control circuit according to claim 4, wherein a shortest issuance interval between respective commands of read, write, activation, and pre-charge is preliminarily specified.

6. The memory control circuit according to claim 5, wherein
the management unit further manages, for each of the plurality of banks, a page miss time until a read or write command issuance to a bank is enabled in an event of occurrence of a page miss in the bank, based on the shortest issuance interval, and
the determination unit
prioritizes read when only read access requests are held in the holding unit,
prioritizes write when only write access requests are held in the holding unit,
does not change the prioritized access type when both read and write access requests are held in the holding unit and there is no bank in which a page miss has occurred, and
when both read and write access requests are held in the holding unit and there is a bank in which a page miss has occurred, does not change the prioritized access type in case where time required for performing all the access requests that are of the same type as the access in which a page is already open, among the access requests held in the holding unit, is equal to or longer than the page miss time, and changes the prioritized access type in case where the time is shorter than the page miss time.

7. The memory control circuit according to claim 1, wherein the determination unit holds the prioritized access type as write regardless of the states of the plurality of banks, in a case where the access type determined to be prioritized at a previous time is write and an amount of use of a data write buffer to the memory is equal to or larger than a threshold value.

8. The memory control circuit according to claim 1, wherein the determination unit holds the prioritized access type as read regardless of the states of the plurality of banks, in a case where the access type determined to be prioritized at a previous time is read and an amount of use of a data read buffer from the memory is equal to or larger than a threshold value.

9. A method of controlling a memory control circuit configured to access a memory including a plurality of banks,
the memory control circuit comprising: a holding unit configured to hold access requests from an external circuit; and a management unit configured to manage states of the plurality of banks, the control method comprising:
determining, based on an access type of each of the access requests held in the holding unit and whether the states of the plurality of banks are open, which access type of command issuance that is read or write is to be prioritized; and
issuing a command of an access request corresponding to the access type determined to be prioritized by the determining, among the access requests held in the holding unit.

* * * * *